United States Patent [19]
Rahman et al.

[11] Patent Number: 5,580,949
[45] Date of Patent: Dec. 3, 1996

[54] METAL ION REDUCTION IN NOVOLAK RESINS AND PHOTORESISTS

[75] Inventors: M. Dalil Rahman, Warwick; Dana L. Durham, East Greenwich, both of R.I.

[73] Assignee: Hoechst Celanese Corporation, Somerville, N.J.

[21] Appl. No.: 458,588

[22] Filed: Jun. 2, 1995

Related U.S. Application Data

[62] Division of Ser. No. 272,962, Jul. 11, 1994, abandoned, which is a continuation of Ser. No. 142,882, Oct. 22, 1993, abandoned, which is a continuation of Ser. No. 809,591, Dec. 18, 1991, abandoned.

[51] Int. Cl.$^6$ .............................. C08G 8/04; B01D 11/00
[52] U.S. Cl. .................. 528/137; 528/129; 528/142; 528/144; 528/147; 528/165; 528/486; 528/487; 528/490; 528/499; 430/311; 210/634; 210/638
[58] Field of Search ........................... 528/129, 165, 528/486, 487, 490, 499, 137, 142, 144, 147; 430/311; 210/634, 638

[56] References Cited

U.S. PATENT DOCUMENTS

| | | | |
|---|---|---|---|
| 2,929,808 | 4/1956 | Ross et al. | 528/486 |
| 4,033,909 | 7/1977 | Papa | 528/482 |
| 4,033,910 | 7/1977 | Papa | 528/486 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,747,954 | 5/1988 | Vaughn et al. | 210/620 |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,286,606 | 12/1994 | Rahman et al. | 430/311 |
| 5,350,714 | 9/1994 | Trefonas, III et al. | 430/331 |

FOREIGN PATENT DOCUMENTS

| | | |
|---|---|---|
| 544324 | 6/1993 | European Pat. Off. . |
| 544325 | 6/1993 | European Pat. Off. . |
| 1072155 | 3/1989 | Japan . |
| 1-228560 | 9/1989 | Japan . |
| 4-65415 | 3/1992 | Japan . |
| 1509354 | 5/1978 | United Kingdom . |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14863 | 7/1994 | WIPO . |
| 94/14858 | 7/1994 | WIPO . |

OTHER PUBLICATIONS

Chemical Abstracts, vol. 112, No. 18, Apr. 30, 1990, Columbus, OH, p. 17, the Abstract 159201u, JP-A-1190713 (Inatomi, Shigeki et al) Jul. 31, 1989.
"Amberlite Ion Exchange Resins Laboratory Guide" by Rohm and Haas Company, Philadelphia, PA, Sep. 1979.
Journal of the Electrochemical Society, vol. 137, No. 12, Dec. 1990, Manchester, New Hampshire US, pp. 393900–393905, XP0001681, T. Tanada "A New Photolithography Tech. w/Antireflective".
Bayard; "Water Free of Heavy Metals for Medical Use and Ion Exchange Resin Used in its Preparation"; Nov. 16, 1992; CA98(26).221589z.
Hirai et al; "Treatment of Waste Waters Containing Formaldehyde and Metals with Chelating Ion Exchange Resins"; Nov. 5, 1975; CA84(14):95328j.
Kimura et al; "Purification of Formaldehyde"; Mar. 9, 1977; CA87(7):52776y.

*Primary Examiner*—Samuel A. Acquah
*Attorney, Agent, or Firm*—Andrew F. Sayko, Jr.

[57] ABSTRACT

The present invention provides methods for producing water insoluble, aqueous alkali soluble novolak resins having a very low level of metal ions, utilizing treated ion exchange resins. A method is also provided for producing photoresist composition having a very low level of metal ions from such novolak resins and for producing semiconductor devices using such photoresist compositions.

5 Claims, No Drawings

METAL ION REDUCTION IN NOVOLAK RESINS AND PHOTORESISTS

This is a divisional of application Ser. No. 08/272,962, filed on Jul. 11, 1994, now abandoned, which is a continuation of Ser. No. 08/142,882, filed on Oct. 22, 1993 (abandoned) which is a continuation of Ser. No. 07/809,591 filed on Dec. 18, 1991, now abandoned.

BACKGROUND OF THE INVENTION

The present invention relates to a process for producing phenolic resins having a very low level of metal ions, especially sodium and iron, and for using such phenolic resins in light-sensitive compositions. The present invention also relates to a process for making light-sensitive compositions useful in positive-working photoresist compositions. Further, the present invention relates to a process for coating substrates with these light-sensitive compositions as well as the process of coating, imaging and developing these light-sensitive mixtures on substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCL gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels of less than 1.0 ppm in the photoresist have been found to adversely affect the properties of such semiconductor devices.

Novolak resins are frequently used a polymeric binder in liquid photoresist formulations. These resins are typically produced by conducting a condensation reaction between formaldehyde and one or more multi-substituted phenols, in the presence of an acid catalyst, such as oxalic acid. In producing sophisticated semiconductor devices, it has become increasingly important to provide novolak resins having metal contamination levels well below 1.0 ppm.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing phenol formaldehyde resins containing very low levels of metal ions, especially sodium and iron, and a process for their use in photoresist compositions. The invention further relates to a process for making positive-working photoresists containing these phenol formaldehyde resins and a photosensitizer, and a process for using such photoresists in producing semiconductor devices.

The process of the subject invention provides water insoluble, aqueous alkali soluble novolak resins obtained by condensing with formaldehyde one or more phenolic compounds, such as meta-cresol, para-cresol, 3,5-dimethylphenol or 3,5-xylenol.

The novolak resins obtained have very low levels of metal ions such as iron, sodium, potassium, calcium, magnesium, copper and zinc. The total metal ion level is preferably less than 1 ppm, more preferably less than 500 ppb. Sodium and iron are the most common metal ion contaminants and among the easiest to detect. The level of these metal ions serves as an indicator of the level of other metal ions. The level of sodium and iron ions, are respectively, less than 100 ppb and 400 ppb, preferably less than 75 ppb and 300 ppb, more preferably less than 50 ppb and 200 ppb, even more preferably less than 30 ppb and 130 ppb and most preferably less than 20 ppb and 20 ppb.

Water insoluble, aqueous alkali soluble novolak resins having a very low levels of metal ions may be obtained by condensing formaldehyde having a very low level of metal ions with one or more phenolic compounds, such as m-cresol, p-cresol, 3,5-dimethyl phenol or 3,5-xylenol, having a very low level of metal ions. The condensation reaction is preferably carried out in the presence of an acid catalyst, such as oxalic acid. In a preferred embodiment of the process of the present invention, the oxalic acid also has a very low level of metal ions.

Water insoluble, aqueous alkali soluble novolak resins may also be obtained by utilizing an acidic ion exchange resin to purify such novolak resins.

DETAILED DESCRIPTION OF THE PREFERRED EMBODIMENT

The present invention provides a process for producing novolak resins having a very low level of metal ions, particularly sodium and iron. In one embodiment, the process utilizes an acidic ion exchange resin to purify the formaldehyde and, in a particularly preferred embodiment, uses the same type of ion exchange resin to purify the acid catalyst, e.g. oxalic acid. The subject process comprises:

a) treating an acidic ion exchange resin with water, preferably deionized water, followed by a mineral acid solution (e.g. a 5–98% solution of sulfuric, nitric or hydrochloric acid) to reduce the level of total sodium and iron ions in the ion exchange resin to less than 500 ppb, preferably less than 100 ppb, more preferably less than 50 ppb and most preferably no more than 20 ppb;

b) passing a water/formaldehyde solution through the ion exchange resin and reducing the level of total sodium and iron ions in the solution to less than 500 ppb, preferably less than 375 ppb, more preferably less than 250 ppb, even more preferably less than 180 ppb and most preferably less than 40 ppb;

c) providing one or more phenolic compounds having a total sodium and iron ion content of less than 200 ppb, preferably less than 100 ppb, more preferably less than 50 ppb and most preferably less than 30 ppb;

d) condensing the formaldehyde with one or more of the phenolic compounds, preferably in the presence of an acid catalyst, more preferably oxalic acid, to produce a water insoluble, aqueous alkali soluble novolak resin having a total sodium and iron ion level of less than 500 ppb, preferably less than 375 ppb, more preferably less than 250 ppb, even more preferably less than 180 ppb and most preferably less than 40 ppb.

The present invention further provides a process for producing a positive photoresist composition having a very low level of total sodium and iron ions. The subject process comprises:

a) treating an acidic ion exchange resin with water, preferably deionized water, followed by a mineral acid solution (e.g. sulfuric, nitric or hydrochloric acid) to reduce the total sodium and iron ions in the ion exchange resin to less than 500 ppb, preferably less than 100 ppb, more preferably less than 50 ppb and most preferably no more than 20 ppb;

b) passing a water/formaldehyde solution through the ion exchange resin and reducing the total sodium and iron ion level to less than 500 ppb, preferably less than 375 ppb, more preferably less than 250 ppb, even more preferably less than 180 ppb and most preferably less than 40 ppb;

c) providing one or more phenolic compounds having a total sodium and iron ion content of less than 200 ppb, preferably less than 100 ppb, more preferably less than 50 ppb and most preferably less than 30 ppb;

d) condensing the formaldehyde with one or more of the phenolic compounds, preferably in the presence of an acid catalyst, more preferably oxalic acid, to produce a water insoluble, aqueous alkali soluble novolak resin having a total sodium and iron ion level of less than 500 ppb, preferably less than 375 ppb, more preferably less than 250 ppb, even more preferably less than 180 ppb and most preferably less than 40 ppb;

e) providing an admixture of: 1) a photosensitive component in an amount sufficient to photosensitize the photoresist composition; 2) the water insoluble, aqueous alkali soluble novolak resin having a low level of total sodium and iron ions and 3) a suitable solvent.

The invention further provides a method for producing a semiconductor device by producing a photo-image on a substrate by coating a suitable substrate with a positive working photoresist composition by:

a) treating an acidic ion exchange resin with water, preferably deionized water, followed by a mineral acid solution (e.g. sulfuric, nitric or hydrochloric acid) to reduce the total sodium and iron ions in the ion exchange resin to less than 500 ppb, preferably less than 100 ppb, more preferably less than 50 ppb and most preferably no more than 20 ppb;

b) passing a water/formaldehyde solution through the ion exchange resin and reducing the total sodium and iron ion level to less than 500 ppb, preferably less than 375 ppb, more preferably less than 250 ppb, even more preferably less than 180 ppb and most preferably less than 40 ppb;

c) providing one or more phenolic compounds having a total sodium and iron ion content of less than 200 ppb, preferably less than 100 ppb, more preferably less than 50 ppb and most preferably less than 30 ppb;

d) condensing the formaldehyde with one or more of the phenolic compounds, preferably in the presence of an acid catalyst, more preferably oxalic acid, to produce a water insoluble, aqueous alkali soluble novolak resin having a total sodium and iron ion level of less than 500 ppb, preferably less than 375 ppb, more preferably less than 250 ppb, even more preferably less than 180 ppb and most preferably less than 40 ppb;

e) providing an admixture of: 1) a photosensitive component in an amount sufficient to photosensitize the photoresist composition; 2) the water insoluble, aqueous alkali soluble novolak resin having a low level of total sodium and iron ions and 3) a suitable solvent;

f) heat treating the coated substrate until substantially all of the solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

It has been found that a novolak resin containing very low levels of metal ion contamination cannot be obtained by first condensing formaldehyde with one or more phenolic compounds, in the presence of an acid catalyst, and then attempting to remove the metal ions from the resin unless: 1) the novolak resin in placed in a solution using a suitable solvent; 2) the ion exchange resin is treated with water and a mineral acid solution, as described above; 3) the ion exchange resin is then thoroughly rinsed with a solvent which is the same as or at least compatible with, the novolak resin solvent; and 4) the novolak resin solution is then passed through the ion exchange resin.

The process for directly purifying the novolak resin process comprises:

a) treating an acidic ion exchange resin with water, preferably deionized water, followed by a mineral acid solution (e.g. a 5–98% solution of sulfuric, nitric or hydrochloric acid) to reduce the total metal ions in the ion exchange resin to less than 500 ppb, preferably less than 100 ppb, more preferably less than 50 ppb and most preferably no more than 20 ppb;

b) providing a solution of novolak resin in a suitable solvent;

c) treating the acidic ion exchange resin with a solvent which is the same as or compatible with the novolak resin solvent, preferably the resin is treated with sufficient solvent to remove a majority of the water remaining on the ion exchange resin, most preferably substantially all of the water is removed; and d) passing the novolak resin solution through the ion exchange resin and reducing the total sodium and iron ion level to less than 500 ppb, preferably less than 375 ppb, more preferably less than 250 ppb, even more preferably less than 180 ppb and most preferably less than 40 ppb.

The present invention further provides a process for producing a positive photoresist composition having a very low level of metal ions. The subject process comprises:

a) treating an acidic ion exchange resin with water, preferably deionized water, followed by a mineral acid solution (e.g. a 5–98% solution of sulfuric, nitric or hydrochloric acid) to reduce the total metal ions in the ion exchange resin to less than 500 ppb, preferably less than 100 ppb, more preferably less than 50 ppb and most preferably no more than 20 ppb;

b) providing a solution of novolak resin in a suitable solvent;

c) treating the acidic ion exchange resin with a solvent which is the same as or compatible with the novolak resin solvent, preferably the resin is treated with sufficient solvent to remove a majority of the water remaining on the ion exchange resin, most preferably substantially all of the water is removed;

d) passing the novolak resin solution through the ion exchange resin and reducing the total sodium and ion ion level to less than 500 ppb, preferably less than 375 ppb, more preferably less than 250 ppb, even more preferably less than 180 ppb and most preferably less than 40 ppb; and e) providing an admixture of: 1) a photosensitive component in an amount sufficient to photosensitize the photoresist composition; 2) the water insoluble, aqueous alkali soluble novolak resin having a low level of metal ions and 3) a suitable solvent.

The invention further provides a method for producing a semiconductor device by producing a photo-image on a substrate by coating a suitable substrate with a positive working photoresist composition by:

a) treating an acidic ion exchange resin with water, preferably deionized water, followed by a mineral acid solution (e.g. a 5–98% solution of sulfuric, nitric or hydrochloric acid) to reduce the total metal ions in the ion exchange resin to less than 500 ppb, preferably less than 100 ppb, more preferably less than 50 ppb and most preferably no more than 20 ppb;

b) providing a solution of novolak resin in a suitable solvent;

c) treating the acidic ion exchange resin with a solvent which is the same as or compatible with the novolak resin solvent, preferably the resin is treated with sufficient solvent to remove a majority of the water remaining on the ion exchange resin, most preferably substantially all of the water is removed;

d) passing the novolak resin solution through the ion exchange resin and reducing the total sodium and iron ion level to less than 500 ppb, preferably less than 375 ppb, more preferably less than 250 ppb, even more preferably less than 180 ppb and most preferably less than 40 ppb;

e) providing an admixture of: 1) a photosensitive component in an amount sufficient to photosensitize the photoresist composition; 2) the water insoluble, aqueous alkali soluble novolak resin having a low level of metal ions and 3) a suitable solvent; and f) heat treating the coated substrate until substantially all of the solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

An acidic ion exchange resin, such as a styrene/divinylbenzene cation exchange resin is utilized in the present process. Such ion exchange resins are available from Rohm and Haas Company, e.g. AMBERLYST 15 resin. These resins typically contain as much as 80,000 to 200,000 ppb of sodium and iron. Before being utilized in the process of the invention, the ion exchange resin must be treated with water and then a mineral acid solution to reduce the metal ion level. Preferably the ion exchange resin is initially rinsed with deionized water, followed by a mineral acid solution such as a 10 percent sulfuric acid solution, rinsed again with deionized water, treated again with the mineral acid solution and once more rinsed with deionized water. When purifying novolak resin solution, it is critical that the ion exchange resin is then rinsed with a solvent which is the same as, or at least compatible with, the novolak resin solvent.

The formaldehyde or novolak resin is preferably passed through a column containing the ion exchange resin as a solution, e.g. a solution of about 38 percent formaldehyde in water and methanol or a solution of about 40 percent novolak resin in propylene glycol methyl ether acetate. Such solutions typically contain from 250 to 1000 ppb each of sodium and iron ions. During the process of the present invention, these levels are each reduced to as low as 10 ppb.

The phenolic compounds condensed with the purified formaldehyde must also have a low level of metal ions. Such low levels may be achieved by distilling such phenolic compounds so that the total sodium and iron ion content is as low as 50 ppb or less.

In a more preferred embodiment of this invention the acid catalyst, e.g. a water solution of oxalic acid, is also passed through a column containing an acidic ion exchange resin. Untreated oxalic acid typically has metal ion levels of about 1000 to 2000 ppb or higher of each of sodium and iron. After treatment by passing through the ion exchange resin, metal levels are reduced to as low as 10 ppb in a 10 percent solution of oxalic acid in deionized water, which is the detection limit of tests used to determine metal ion levels. Even though only about 1 percent of oxalic acid is typically utilized as a catalytic amount in the preferred embodiment of the present process, its contribution of the metal ion concentration could be very high.

The present invention provides a process for producing a photoresist composition and a process for producing semiconductor devices using such photoresist composition. The photoresist composition is formed by providing an admixture of a photosensitizer, the subject water insoluble, aqueous alkali soluble novolak resin and a suitable solvent. Suitable solvents for such photoresists and for novolak resins may include propylene glycol monoalkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA) and ethyl-3-ethoxypropionate (EEP).

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C. I. No. 42535), Crystal Violet (C. I. 42555). Malachite Green (C. I. No. 42000), Victoria Blue B (C. I. No. 44045) and Neutral Red (C. I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/ aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Example 1

25 grams of dry AMBERLYST 15 ion exchange resin beads were placed in a conical flask and deionized water was added so that all of the resin beads were under water. The flask was sealed and allowed to stand overnight to swell the resin beads. The next morning the water was decanted, deionized water added to cover the resin beads and the flask was shaken slowly. The water was again decanted. The rinsing with deionized water and decanting steps were repeated three more times. The resulting slurry of ion exchange resin was poured into a 21.5 cm. long glass column having a diameter of 2 cm. and equipped with a porous disk and a stopcock. The resin was allowed to settle to the bottom and the column was back flushed with deionized water for 25 minutes. The resin was again allowed to settle to the bottom.

The bed length was measured and the bed volume was calculated as 68 ml. A 10 percent sulfuric acid solution was passed down through the resin bed at a rate of about 16 ml./min (14.1 bed volumes/hour). 6 bed volumes of the acid solution were passed through the resin bed. 60 bed volumes of deionized water were then passed down through the resin bed at about the same flow rate. The pH of the effluent water was measured to assure that it matched the pH of 6 for fresh deionized water. 500 grams of a 37 percent formaldehyde solution in water and 7 percent methanol, having a pH of about 3.5 and containing about 240 ppb of sodium and about 4900 ppb of iron was passed down through the resin bed at the same flow rate. The formaldehyde obtained had a very low level of metal ions as follows: sodium - 20 ppb, iron - <100 ppb.

Example 2

48 lbs. of wet AMBERLYST 15 ion exchange resin beads (38 lbs. dry) were placed in a 1.2 ft.$^3$ resin canister, having a pressure rating of 40 psig. Into a 500 gal. glass-lined feed kettle, having a pressure rating of 100 psig, an agitator and a 3 inch 101 psig rupture disk, was fed 100.0 gal. of deionized water. The feed kettle was pressurized to 20 psig using nitrogen and water was slowly transferred through a bottom outlet valve through the resin canister through a feed valve into a glass-lined product kettle, having a pressure rating of 150 psig and a 2 inch 100/100 psig double rupture disk. Both kettles were then drained.

With all valves closed, 55 gal. of deionized water and then 55 lbs. of 98 percent sulfuric acid were charged to the feed kettle. The agitator was set at 60 rpm and the temperature was maintained at 20°–30° C. The feed kettle was pressurized to 20 psig using nitrogen and the bottom outlet valve was opened to slowly transfer the sulfuric acid solution through the resin canister through the open inlet valve to the product kettle. The inlet valve was opened so as to obtain a liquid flow rate of about 0.35 gal./min. The feed kettle and product kettle were then drained, the feed kettle outlet valve to the resin canister was closed and the feed kettle was rinsed with deionized water.

450 gal. of deionized water was charged to the feed kettle; the temperature was maintained at 20°–30° C. and the agitator was set at 60 rpm. The feed kettle was pressurized to 20 psig using nitrogen and the bottom outlet valve opened to slowly transfer the water through the resin canister through the inlet valve to the product canister at a liquid flow rate of about 1.8 gal./min. The pH of the water in the product kettle was tested to assure that it matched the pH of fresh deionized water. The contents of the feed and product canisters were completely drained after turning off the agitator and all valves were closed.

110 gal. of a 37 percent formaldehyde solution in water and 7 percent methanol, having 280 ppb sodium and 280 ppb iron was charged to the feed kettle and the temperature was maintained at 20°–30° C. The bottom outlet valve was opened to slowly transfer the formaldehyde solution through the resin canister. The inlet valve of the product kettle was opened to obtain a liquid flow rate of about 0.7 gal./min. into the product kettle. The formaldehyde obtained had a very low level of metal ions as follows: sodium-<20 ppb, iron - <20 ppb.

Example 3

248 lbs. of wet AMBERLYST 15 ion exchange resin beads (196 lbs. dry) were placed in a 6.2 ft.$^3$ resin canister, having a pressure rating of 40 psig.

Into the resin canister, cleaned according to the cleaning process set forth in Example 2 was fed 3145 lbs. of formaldehyde as a 37 percent formaldehyde solution in water and 7 percent methanol, having about 280 ppb sodium and 280 ppb iron. The formaldehyde solution was slowly transferred through the resin canister at a flow rate of about 33.3 lbs. of solution per minute. The formaldehyde obtained had a very low level of metal ions as follows: sodium - 10 ppb, iron - 20 ppb.

Example 4

The procedure of Example 3 was repeated and 3050 lbs. of formaldehyde as a 37 percent solution in water and 7 percent methanol was passed through the resin canister. The formaldehyde obtained has a solution ion level of <10 ppb and an iron ion level of <20 ppb.

Example 5

180 grams of dry AMBERLYST 15 ion exchange resin beads were placed in a conical flask and deionized water was added so that all of the resin beads were under water. The flask was sealed and allowed to stand overnight to swell the resin beads. The next morning the water was decanted, deionized water added to cover the resin beads and the flask was shaken slowly. The water was again decanted. The rinsing with deionized water and decanting steps were repeated three more times. The resulting slurry of ion exchange resin was poured into a 500 ml. glass column having a porous disk and a stopcock. The resin was allowed to settle to the bottom and the column was back flushed with deionized water for 25 minutes. The resin was again allowed to settle to the bottom.

The bed length was measured and the bed volume was calculated as 500 ml. A 10 percent sulfuric acid solution was passed down through the resin bed at a rate of about 16 ml./min (14.1 bed volumes/hour). 6 bed volumes of the acid solution were passed through the resin bed. 50 bed volumes of deionized water were then passed down through the resin bed at about the same flow rate. The pH of the effluent water was measured to assure that it matched the pH of 6 for fresh deionized water.

3600 grams of an 8 percent oxalic acid solution in water containing about 110 ppb of sodium and about 140 ppb of iron was passed down through the resin bed at the same flow rate. The oxalic acid obtained had a very low level of metal ions as follows: sodium - <10 ppb, iron - <10 ppb.

Example 6

258.5 lbs. of a 37 percent solution of the low metal ion containing formaldehyde of Example 2 was placed into a 100 gal. teflon-lined feed kettle, having a pressure rating of 100 psig an agitator and a 2 inch 60 psig rupture disk. Into a 500 gal. glass-lined solvent kettle was added 600 lbs. of liquid ethoxy-3-ethoxypropionate solvent (EEP).

Into a 200 gal. stainless steel lined reaction kettle, having a pressure rating of 300 psig and a 3 inch 115 psig rupture disk, 5 lbs. of the oxalic acid of Example 3 was added as a powder, through a 2 inch port with a ball valve. 357.2 lbs. of a mixture of 45.2 percent m-cresol, 40.6 percent p-cresol and 14.0 percent 2,5-xylenol, having metal ion levels of <10 ppb sodium and 270 ppb iron, 48.6 lbs. of m-cresol liquid having metal ion levels of 250 ppb sodium and 70 ppb iron, and 95.0 lbs. of p-cresol liquid having metal ion levels of 300 ppb sodium and 40 ppb iron.

The reaction kettle agitator was set at 100 rpm and the temperature was maintained at 92°–96° C. From the feed kettle, over a 90 minute period, was added 258.6 lbs. of the formaldehyde solution at a mass flow rate of about 2.9 lbs./min. The temperature was then maintained at 92°–96° C. for 7 hours. Atmospheric distillation of the solvent was initiated and the distillate was allowed to flow to the feed kettle. The temperature of the reaction mixture was raised over a period of 3 hours to about 190° C. Additional heat and vacuum were applied to the reaction kettle until the temperature reached about 200° C. and 35 mm Hg vacuum, which was held for about 15 minutes. The vacuum was then released and the reaction was complete.

From the solvent kettle was added 600 lbs. of EEP, over a period of about 35 min., into the reaction kettle. The reactant was dissolved in the EEP and the resulting solution of novolak resin was passed through a 0.4 micron Cuno cartridge filter. A solution of 40 percent novolak in EEP contained: 40 ppb sodium, 60 ppb iron, <10 ppb potassium, <10 ppb calcium, <10 ppb magnesium, 30 ppb copper and <10 ppb zinc.

The solution was again filtered by passing through a 0.2 micron Acrodisc flat filter. The metals ion levels were: 14 ppb sodium, 15 ppb iron, <10 ppb potassium, <10 ppb calcium, <10 ppb magnesium, 25 ppb copper and <10 ppb zinc.

Example 7

The process of Example 6 was repeated and the metal ion levels measured for the 40 percent novolak resin solution were: <20 ppb sodium and 40 ppb iron.

Example 8

The process of Example 6 was repeated and the metal ion levels measured for the 40 percent novolak resin solution were: <20 ppb sodium and <20 ppb iron.

Example 9

The process of Example 6 was repeated and the metal ion levels measured for the 40 percent novolak resin solution were: <20 ppb sodium and 60 ppb iron.

Example 10

Into a 2000 gal. stainless steel lined reaction kettle, having a pressure rating of 300 psig and a 3 inch 115 psig rupture disk was added. 62 lbs. of unpurified oxalic acid as a powder and 5 gal. of DI water, through a port with a ball valve. 6243 lbs. of a mixture of 41.6 percent m-cresol, 47.7 percent p-cresol and 10.6 percent of a 55/45 mixture of 2,5-xylenol and 2,4-xylenol was added.

The reaction kettle agitator was set at about 100 rpm and the temperature was maintained at 92°–96° C. Over a 90 minute period, was added 3145 lbs. of the formaldehyde solution of Example 2 at a mass flow rate of about 33.3 lbs/min. The temperature was then maintained at 92°–96° C. for 7 hours. Atmospheric distillation of the solvent was initiated and the temperature of the reaction mixture was raised over a period of 6 hours at about 190° C. Additional heat and vacuum were applied to the reaction kettle until the temperature reached about 200° C. and 35mmHg vacuum, which was held for about 30 minutes. The vacuum was then released and the reaction was complete.

7500 lbs. of PGMEA was added into the reaction kettle, over a period of about 35 minutes. The product was dissolved in the PGMEA and the resulting solution of novolak resin was passed through a 0.4 micron Cuno cartridge filter. The resulting solution of 40 percent novolak in PGMEA contained 64 ppb sodium ions, 28 ppb potassium ions, 47 ppb iron ions, 43 ppb chromium ions, 47 ppb calcium ions and 30 ppb aluminum ions.

Example 11

The procedure of Example 10 was repeated by using 3050 lbs. of formaldehyde as a 37 percent solution of the low metal ion containing formaldehyde of Example 2. The product was dissolved in about 7500 lbs. of PGMEA. The resulting 40 percent solution of novolak in PGMEA contained 43 ppb sodium ions, 15 ppb potassium ions, 56 ppb iron ions, 86 ppb chromium ions, 45 ppb calcium ions and 28 ppb aluminum ions.

Comparative Example 12

The process of Example 2 was repeated except that the formaldehyde, was not passed through the ion exchange resin bed to reduce the metal ion content. A novolak resin was produced, as in Example 6 and dissolved in diglyme to provide a solution containing 20 weight percent of the novolak resin. This untreated solution contained about 150 ppb sodium and about 1400 ppb iron. This solution was then passed through an ion exchange resin bed, according to the procedure set forth in Example 5. The resulting solution had a sodium content of about 110 ppb and an iron content of about 1250 ppb.

Example 13

A column was made with Amberlyst-15 (bed volume 45 ml) and cleaned as in Example 1. Sufficient amount of distilled dyglyme was passed through the column to remove substantially all of the water and then 74 g of an unpurified novolak resin (having the same composition as the purified novolak resin of Example 6) solution in PGMEA containing 1300 ppb of sodium and 210 ppb of iron was passed through the column. Initial 14 mL, column dead volume (mostly dyglyme) was discarded. The resin solution obtained had a very low level of metal ions as follows: sodium - <20 ppb, iron - <20 ppb.

Example 14

The process of Example 13 was repeated and 104 g of same resin solution was cleaned and metal levels measured were: sodium - 20 ppb and iron - <20 ppb.

Example 15

Photoresist solutions were prepared from a 45.82 weight percent solution of the purified novolak resin of Example 6 in EEP by adding three different concentrations of 2,1,5-diazo ester of 2,3,4,4'-tetrahydroxybenzophenone (PAC), i.e. 8 percent, 12 percent and 16 percent (percent by weight, of total solids). The photoresist solutions were each spin coated, using standard techniques, onto quartz plates at a constant speed to obtain layers of photoresist having an initial thickness of 1.5 um. The films were baked in a circulating air oven at 90° C. for 30 minutes. RO and R were determined for each photoresist composition.

RO was determined in a 0.263N TMAH developer (25+/−0.5° C.). RO is the unexposed or dark film loss and was determined by placing the films in developer for 30 minutes and measuring the total film loss. RO is reported as rate of film loss in Angstroms per minute.

R, the film loss rate of completely bleached film, was also determined in 0.263N TMAH developer (25+/−0.5° C.) for each photoresist formulation. The dose required to completely bleach each film was found by measuring the absorbance at 377 nm for 1.5 um films on quartz plates after exposure to varying levels of radiation. R was calculated by measuring the time required to completely dissolve the 1.5 um bleached films. R is also reported as Angstroms per minute.

The dose to clear was determined by exposing the 1.5 um films to narrow band 365+/−10 nm radiation under the Optoline gradient mask and calculating the energy required to obtain the first clear or completely developed step. All development was in 0.263 TMA Hat 25+/−0.5° C. for 1 minute.

| % PAC | R | RO | R/RO | DOSE TO CLEAR (mj/sq. cm.) |
|---|---|---|---|---|
| 8 | 39,940 | 244 | 164 | 80 |
| 12 | 73,180 | 34 | 2,184 | 83 |
| 16 | 111,000 | 9 | 13,000 | 106 |

We claim:

1. A method for producing a water insoluble, aqueous alkali soluble novolak resin comprising:
   a) washing an acidic ion exchange resin With deionized water, washing said ion exchange resin with a mineral acid solution and thereby reducing the total sodium and iron ions in the ion exchange resin to less than 100 ppb;
   b) passing a water/formaldehyde solution through said ion exchange resin and thereby reducing the total sodium and iron ion level of said solution to less than 40 ppb;
   c) providing one or more phenolic compounds having a total sodium and iron ion content of less than 50 ppb;
   d) condensing said formaldehyde with said one or more phenolic compounds, in the presence of an acid catalyst, and thereby producing a water insoluble, aqueous alkali soluble novolak resin having a total sodium and iron ion level of less than 40 ppb.

2. The method of claim 1 wherein said acid catalyst is passed through said ion exchange resin.

3. A method for producing a water insoluble, aqueous alkali soluble novolak resin having a very low metal ion content comprising:
   a) treating an acidic ion exchange resin with water, followed by washing said ion exchange resin with a mineral acid solution and thereby reducing the total sodium and iron ion level in said ion exchange resin to less than 100 ppb;
   b) providing a solution of a novolak resin in a suitable solvent;
   c) washing said ion exchange resin with a solvent which is compatible with the novolak resin solvent; and
   d) passing the novolak resin solution through said ion exchange resin and thereby reducing the total sodium and iron ion level of said solution to less than 40 ppb.

4. The method of claim 3 wherein said solvent is selected from the group consisting of propylene glycol methyl ether acetate and ethyl-3-ethoxypropionate.

5. The method of claim 3 wherein the novolak resin solvent and the solvent used for washing said ion exchange resin are identical.

* * * * *